US007548482B2

United States Patent
Yang et al.

(10) Patent No.: US 7,548,482 B2
(45) Date of Patent: Jun. 16, 2009

(54) MEMORY DEVICE FOR EARLY STABILIZING POWER LEVEL AFTER DEEP POWER DOWN MODE EXIT

(75) Inventors: Hui-kap Yang, Hwaseong-si (KR); Young-gu Kang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 252 days.

(21) Appl. No.: 11/593,967

(22) Filed: Nov. 7, 2006

(65) Prior Publication Data

US 2007/0165464 A1 Jul. 19, 2007

(30) Foreign Application Priority Data

Jan. 17, 2006 (KR) .................... 10-2006-0004877

(51) Int. Cl.
*G11C 7/00* (2006.01)
(52) U.S. Cl. ............... 365/229; 365/189.4; 365/226
(58) Field of Classification Search ........... 365/189.07, 365/226, 229
See application file for complete search history.

(56) References Cited

U.S. PATENT DOCUMENTS

| | | | | |
|---|---|---|---|---|
| 5,804,893 | A * | 9/1998 | Fujioka | 307/125 |
| 5,982,222 | A | 11/1999 | Kyung | 327/536 |
| 6,201,436 | B1 | 3/2001 | Hur et al. | 327/543 |
| 6,510,096 | B2 * | 1/2003 | Choi et al. | 365/226 |

FOREIGN PATENT DOCUMENTS

| | | |
|---|---|---|
| JP | 2003-195955 | 7/2003 |
| KR | 100172370 | 10/1998 |
| KR | 10-0278663 | 2/2001 |

* cited by examiner

*Primary Examiner*—Hoai V Ho
(74) *Attorney, Agent, or Firm*—Mills & Onello LLP

(57) ABSTRACT

A memory device for early stabilization and rapid increase of a power level after deep power down exit includes a deep power down exit pulse generator, a deep power down exit mode signal generator, a current driving unit, a controller and a voltage generator. The deep power down exit pulse generator generates a deep power down exit pulse signal having a predetermined pulse width in response to a deep power down command. The deep power down exit mode signal generator generates a deep power down exit mode bias signal in response to the deep power down exit pulse signal. The current driving unit generates a deep power down exit mode reference voltage in response to the deep power down exit mode bias signal and a reference signal. The controller generates an enable signal in response to the deep power down exit mode bias signal or an active command. The voltage generator compares the deep power down exit mode reference voltage to an internal power supply voltage in response to the enable signal and outputs the internal power supply voltage. The memory device previously generates the internal power supply voltage, which is used in the active mode, in a deep power down exit mode before an active command is applied to the memory device, and thus a power-up ensuring time after deep power down mode exit can be reduced.

18 Claims, 7 Drawing Sheets

MEMORY DEVICE FOR EARLY STABILIZING POWER LEVEL AFTER DEEP POWER DOWN MODE EXIT

CROSS-REFERENCE TO RELATED PATENT APPLICATION

This application claims priority under 35 U.S.C. 119 to Korean Patent Application No. 10-2006-0004877, filed on Jan. 17, 2006, in the Korean Intellectual Property Office, the disclosure of which is incorporated herein in its entirety by reference.

BACKGROUND OF THE INVENTION

1. Field of the Invention

The present invention relates to a semiconductor memory device, and more particularly, to a memory device for early stabilizing a power level after deep power down mode exit.

2. Description of the Related Art

In general, a semiconductor memory device has various operation modes including a standby mode, an active mode and a deep power down mode. In the standby mode, a chip enable signal /CE is at a logic high level and no chip is selected. In the active mode, commands are applied to the semiconductor memory device to enable read and write operations of the semiconductor memory. Internal power supply voltages in the standby mode are equal to those in the active mode. In the deep power down mode, the internal power supply voltages in the standby mode and the active mode are lowered to stop circuits operated by the internal power supply voltages and to lower current consumption to zero in an internal voltage generator including a boost circuit or a buck circuit.

FIG. 1 is a diagram for explaining the operation of a memory device when the operation mode of the memory device is changed from a deep power down (DPD) mode to a standby mode or to an active mode. Referring to FIG. 1, the memory device enters into the DPD mode when a DPD command signal is transitioned from a logic high level to a logic low level. The DPD mode lowers an internal power supply voltage of the device formerly operating in the standby mode or active mode to 0V.

When the DPD command signal is later changed from a logic low level to a logic high level, the memory device exits the DPD mode and the internal power supply voltage is boosted to a set level from 0V. The internal power supply voltage requires a certain period of time to be boosted to the set level from 0V. Accordingly, the memory device enters into the standby mode or the active mode after a lapse of power-up ensuring time after DPD mode exit.

FIG. 2 is a block diagram of a conventional memory device 200 that requires a power-up ensuring time after exiting the DPD mode. Referring to FIG. 2, the memory device 200 requires many different internal power supply voltages. These internal power supply voltages include a voltage used in a memory cell array block, a voltage used in a peripheral circuit, a voltage used in the DPD mode, a voltage used in the standby mode and a voltage used in the active mode.

The memory device 200 includes a circuit 210 for generating an internal voltage for the standby mode, a circuit 220 for generating an internal voltage for the active mode, a circuit 230 for generating an array internal voltage for the standby mode, a circuit 240 for generating an array internal voltage for the active mode, a circuit 250 for generating a high voltage for the standby mode, a circuit 260 for generating a high voltage for the active mode, and a DC bias circuit 270.

The circuits 210, 230 and 250 for generating the internal voltages for the standby mode respectively generate an internal power supply voltage VINT, an array internal power supply voltage VINTA and a high voltage VPP used in the standby mode in response to a DPD command DPD. The circuits 220, 240 and 260 for generating the internal voltages for the active mode respectively generate an internal power supply voltage VINT, an array internal power supply voltage VINTA and a high voltage VPP used in the active mode in response to an active command ACT.

The internal power supply voltage VINT, the array internal power supply voltage VINTA and the high voltage VPP used in the standby mode are respectively equal to the internal power supply voltage VINT, the array internal power supply voltage VINTA and the high voltage VPP used in the active mode. However, the quantities of the driving currents of the internal power supply voltage VINT, the array internal power supply voltage VINTA and the high voltage VPP used in the active mode are larger than those of the internal power supply voltage VINT, the array internal power supply voltage VINTA and the high voltage VPP used in the standby mode.

The internal power supply voltage VINT, the array internal power supply voltage VINTA and the high voltage VPP when the memory device exits the DPD mode have the current drivability of the internal power supply voltage VINT, the array internal power supply voltage VINTA and the high voltage VPP generated by the circuits 210, 230 and 250 for generating the internal voltages for the standby mode. Accordingly, the memory device 200 requires a time period for the internal power supply voltage VINT, the array internal power supply voltage VINTA and the high voltage VPP to have the current drivability applied to a suitable level in the active mode after DPD mode exit. For this reason, the memory device 200 requires the power-up ensuring time following the DPD mode exit, as illustrated in FIG. 1.

The power-up ensuring time after DPD mode exit is generally set to 200 μS by memory device specifications. This time is considerably long for systems including the memory device. Accordingly, a method of reducing the power-up ensuring time after DPD mode exit is required.

SUMMARY OF THE INVENTION

The present invention provides a memory device capable of reducing a power-up ensuring time after DPD mode exit.

According to an aspect of the present invention, there is provided a memory device comprising a bias controller receiving a deep power down command and generating a deep power down exit mode bias signal, and an internal power supply voltage generator generating an internal power supply voltage used in an active mode in response to an active command or the deep power down exit mode bias signal.

The bias controller may comprise a pulse generating unit receiving the deep power down command and generating a deep power down exit pulse signal and the deep power down exit mode bias signal, and a current driving unit generating a deep power down exit mode reference voltage in response to the deep power down exit mode bias signal and a reference voltage.

The pulse generating unit may comprise a deep power down exit pulse generator generating the deep power down exit pulse signal having a predetermined pulse width in response to a falling edge of the deep power down command signal, and a deep power down exit mode signal generator generating the deep power down exit mode bias signal in response to the deep power down exit pulse signal.

The deep power down exit pulse generator may comprise a delay stage delaying and inverting the deep power down command signal and a NOR gate receiving the deep power down command signal and the output signal of the delay stage and outputting the deep power down exit pulse signal.

The deep power down exit mode signal generator may be composed of a buffer receiving the deep power down exit pulse signal and outputting the deep power down exit mode bias signal.

The deep power down exit mode signal generator may comprise a first node voltage generator generating a first node voltage distributed from the reference voltage in response to the deep power down exit pulse signal, a second node voltage generator generating a second node voltage distributed from a power supply voltage in response to the deep power down exit pulse signal, a comparator comparing the first and second node voltages to each other in response to the deep power down exit pulse signal, and a buffer receiving the output signal of the comparator and outputting the deep power down exit mode bias signal.

The first node voltage generator may comprise a first resistor having a first terminal to which the reference voltage is applied, a second resistor having a first terminal connected to a second terminal of the first resistor, and an NMOS transistor connected between a second terminal of the second resistor and a ground voltage, the NMOS transistor having a gate to which the deep power down exit pulse signal is applied. The first node voltage may be generated at the connecting node between the first and second resistors.

The second node voltage generator may comprise a first resistor having a first terminal to which the power supply voltage is applied, a second resistor having a first terminal connected to a second terminal of the first resistor, and an NMOS transistor connected between a second terminal of the second resistor and the ground voltage, the NMOS transistor having a gate to which the deep power down exit pulse signal is applied. The second node voltage may be generated at the connecting node between the first and second resistors.

The current driving unit may comprise a comparator comparing the reference voltage to the deep power down exit mode reference voltage, a PMOS transistor having a gate receiving the output signal of the comparator and a source to which the power supply voltage is applied, first, second, third and fourth resistors serially connected between the drain of the PMOS transistor and the ground voltage, a first NMOS transistor connected between both terminals of the second resistor, the first NMOS transistor having a gate to which the deep power down exit mode bias signal is applied, and a second NMOS transistor connected between both terminals of the fourth resistor, the second NMOS transistor having a gate to which the deep power down exit mode bias signal is applied.

The internal power supply voltage generator may comprise a controller generating an enable signal in response to the deep power down exit mode bias signal or the active command, and a voltage generator comparing the deep power down exit mode reference voltage to the internal power supply voltage and outputting the internal power supply voltage in response to the enable signal.

The controller may comprise a transfer gate transferring the active command in response to the deep power down exit mode bias signal, a PMOS transistor connected between the power supply voltage and the output terminal of the transfer gate, the PMOS transistor having a gate to which the deep power down exit mode bias signal is applied, a latch latching the output signal of the transfer gate, and an inverter receiving the output signal of the latch and outputting the enable signal.

The voltage generator may comprise a first PMOS transistor having a source to which the power supply voltage is applied, a second PMOS transistor having a source to which the power supply voltage is applied, a gate and a drain connected to the gate of the first PMOS transistor, a first NMOS transistor having a drain connected to the drain of the first PMOS transistor and a gate to which the deep power down exit mode reference voltage is applied, a second NMOS transistor having a drain connected to the drain of the second PMOS transistor and a gate to which the internal power supply voltage is applied, a third NMOS transistor having a drain connected to the sources of the first and second NMOS transistors, a source to which the ground voltage is applied, and a gate to which the enable signal is applied, a third PMOS transistor connected between the drains of the first and second NMOS transistors, the third PMOS transistor having a gate to which the enable signal is applied, and a fourth PMOS transistor connected between the power supply voltage and the internal power supply voltage, the fourth PMOS transistor having a gate connected to the drain of the first NMOS transistor.

According to another aspect of the present invention, there is provided a memory device comprising a deep power down exit pulse generator generating a deep power down exit pulse signal having a predetermined pulse width in response to a deep power down command, a deep power down exit mode signal generator generating a deep power down exit mode bias signal in response to the deep power down exit pulse signal, a current driving unit generating a deep power down exit mode reference voltage in response to the deep power down exit mode bias signal and a reference signal, a controller generating an enable signal in response to the deep power down exit mode bias signal or an active command, and a voltage generator comparing the deep power down exit mode reference voltage to an internal power supply voltage in response to the enable signal and outputting the internal power supply voltage.

Accordingly, the memory device of the present invention generates in advance the internal power supply voltage, which is used in the active mode, in a deep power down exit mode before an active command is applied to the memory device, and thus the power-up ensuring time period following exit from a deep power down mode can be reduced.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS OF THE INVENTION

Figure 1:
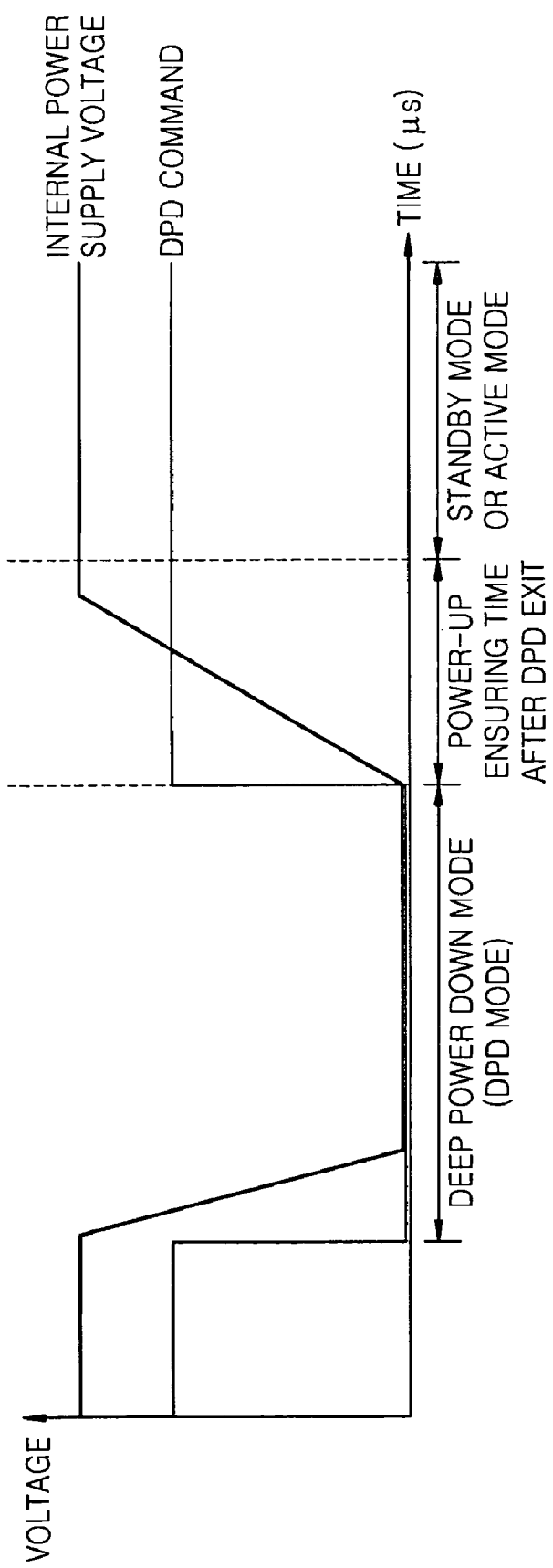
FIG. 1 is a diagram for explaining the operation of a memory device when the operation mode of the memory device is changed from a DPD mode to a standby mode or an active mode.
Figure 2:
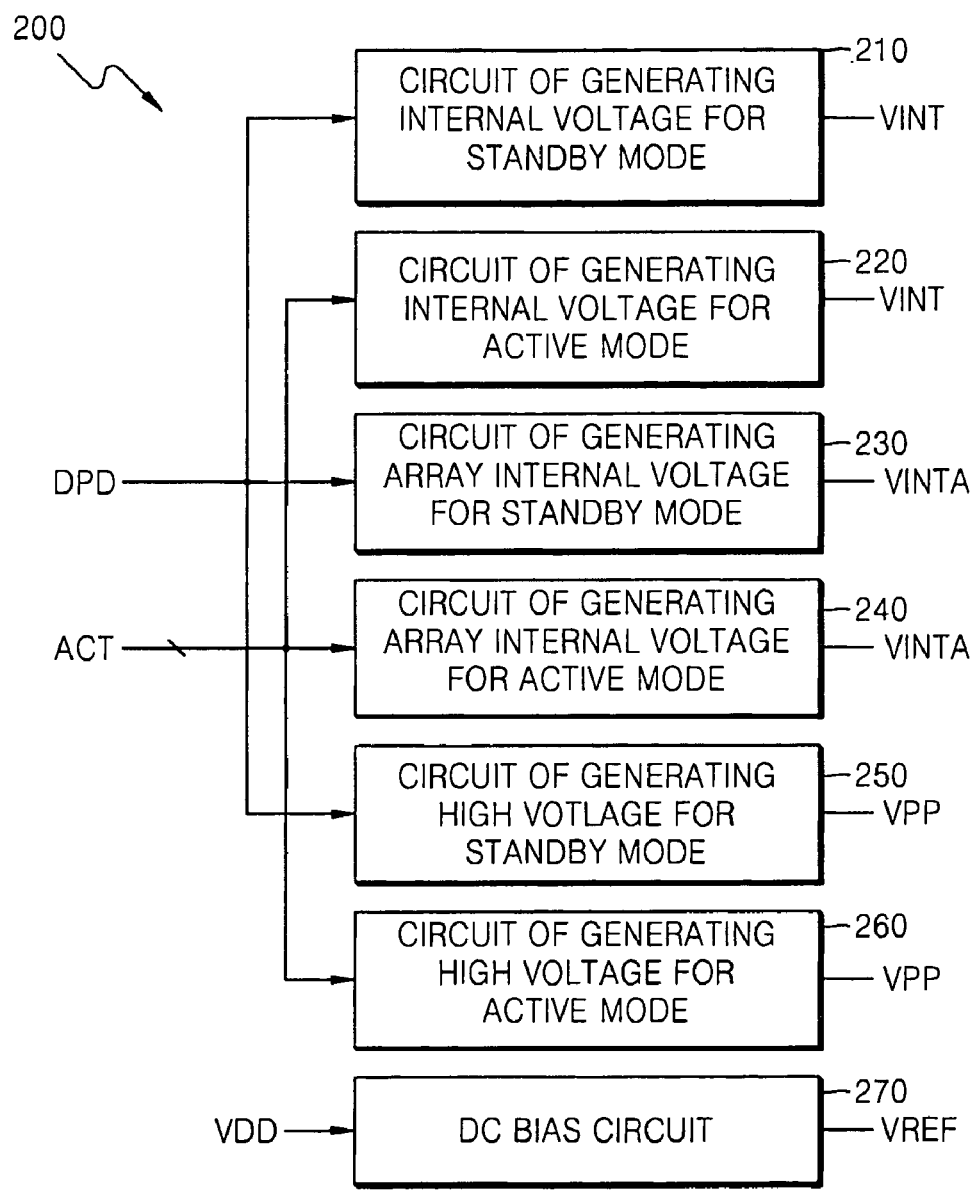
FIG. 2 is a block diagram of a conventional memory device that requires a power-up ensuring time after exiting a DPD mode.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete. Throughout the drawings, like reference numerals refer to like elements.

Figure 3:
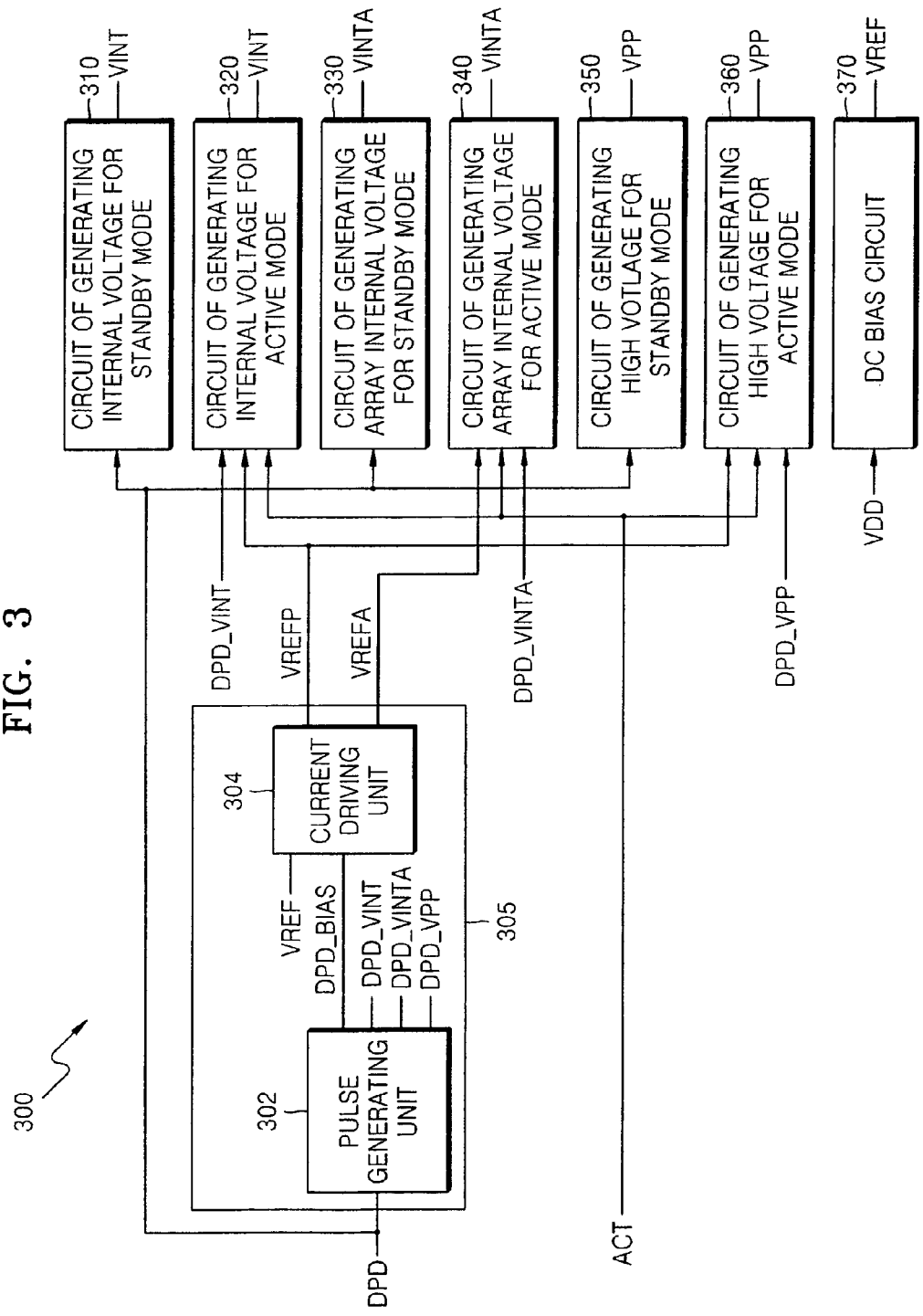
FIG. 3 is a block diagram of a memory device according to an embodiment of the present invention.

FIG. 3 is a block diagram of a memory device 300 according to an embodiment of the present invention. Referring to FIG. 3, the memory device 300 includes a DC bias control circuit 305, a circuit 310 for generating an internal voltage for a standby mode, a circuit 320 for generating an internal voltage for an active mode, a circuit 330 for generating an array internal voltage for the standby mode, a circuit 340 for generating an array internal voltage for the active mode, a circuit 350 for generating a high voltage for the standby mode, a circuit 360 for generating a high voltage for the active mode, and a DC bias circuit 370.

The circuit 310 for generating the internal voltage for the standby mode, the circuit 330 for generating the array internal voltage for the standby mode and the circuit 350 for generating the high voltage for the standby mode respectively generate an internal power supply voltage VINT, an array internal power supply voltage VINTA and a boosted voltage VPP used in the standby mode in response to a DPD command DPD. The circuit 320 for generating the internal voltage for the active mode, the circuit 340 for generating the array internal voltage for the active mode and the circuit 360 for generating the high voltage for the active mode respectively generate an internal power supply voltage VINT, an array internal power supply voltage VINTA and a boosted voltage VPP used in the active mode. The circuits 320, 340 and 360 generate the internal power supply voltage VINT, the array internal power supply voltage VINTA and the boosted voltage VPP of the active mode even in a DPD exit mode before entering the active mode.

The DC bias control circuit 305 includes a pulse generating unit 302 and a current driving unit 304. The pulse generating unit 302 receives the DPD command DPD and generates a DPD exit mode bias voltage DPD_BIAS and DPD exit mode internal voltages DPD_VINT, DPD_VINTA and DPD_VPP. The current driving unit 304 receives the DPD exit mode bias signal DPD_BIAS and a reference voltage VREF and generates DPD exit mode reference voltages VREFP and VREFA.

Figure 4:
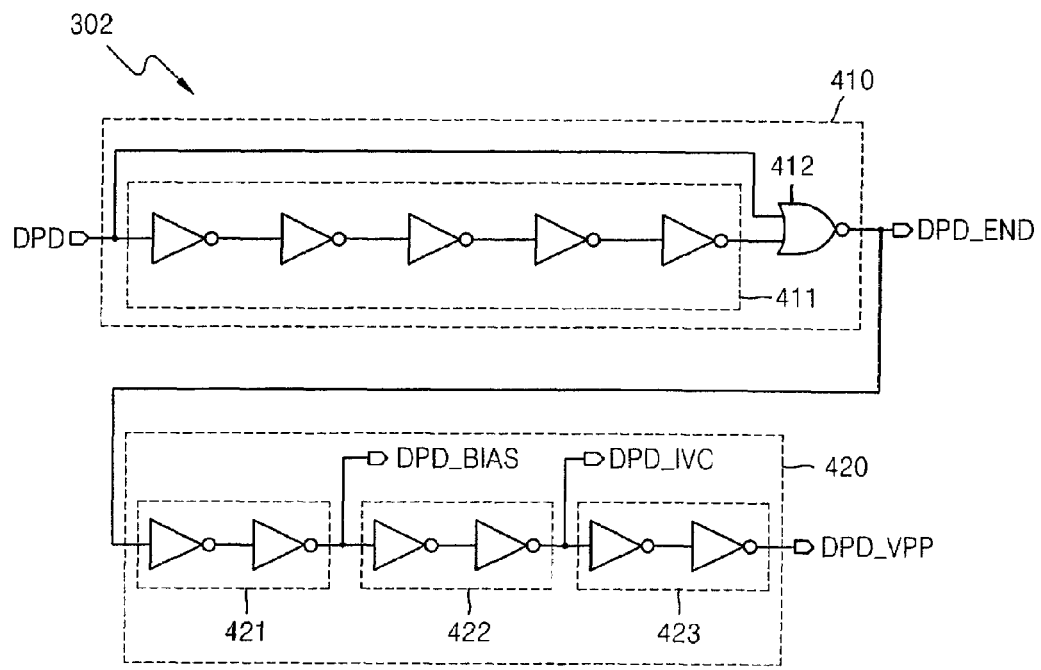
FIG. 4 is a circuit diagram of a pulse generator of FIG. 3 according to an embodiment of the present invention.

FIG. 4 is a circuit diagram of the pulse generating unit 302 according to an embodiment of the present invention. Referring to FIG. 4, the pulse generating unit 302 includes a DPD exit pulse generator 410 and a DPD exit mode signal generator 420. The DPD exit pulse generator 410 includes a delay stage 411 that delays and inverts the DPD command DPD and a NOR gate 412 that receives the output signal of the delay stage 411 and the DPD command DPD and generates a DPD exit pulse signal DPD_END. The DPD exit pulse generator 410 generates the DPD exit pulse signal DPD_END having a predetermined pulse width in response to a falling edge of the DPD command signal DPD.

The DPD exit mode signal generator 420 includes a first buffer 421 for receiving and delaying the DPD exit pulse signal DPD_END and outputting the DPD exit mode bias signal DPD_BIAS, a second buffer 422 for receiving and delaying the DPD exit mode bias signal DPD_BIAS and outputting a DPD exit mode internal power supply signal DPD_IVC, and a third buffer 423 for receiving and delaying the DPD exit mode internal power supply signal DPD_IVC and outputting a DPD exit mode boosted signal DPD_VPP.

Figure 5:
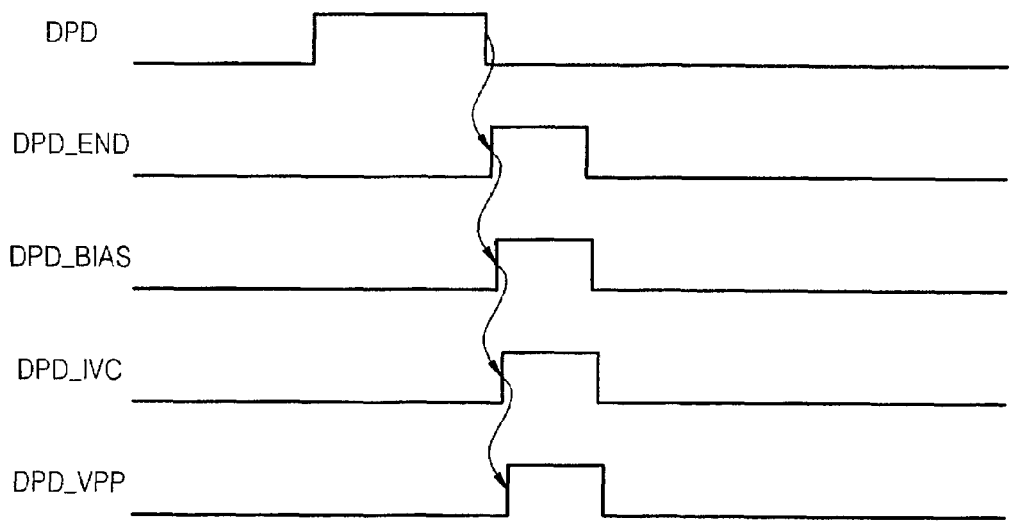
FIG. 5 is a timing diagram showing the operation of the pulse generator of FIG. 4.

The pulse generating unit 302 generates the DPD exit pulse signal DPD_END having a predetermined pulse width in response to a falling edge of the DPD command signal DPD, as illustrated in FIG. 5. In addition, the pulse generating unit 302 generates the DPD exit mode bias signal DPD_BIAS, the DPD exit mode internal power supply signal DPD_IVC and the DPD exit mode boosted signal DPD_VPP, each of which is delayed from the DPD exit pulse signal DPD_END by a predetermined time period.

Figure 6:
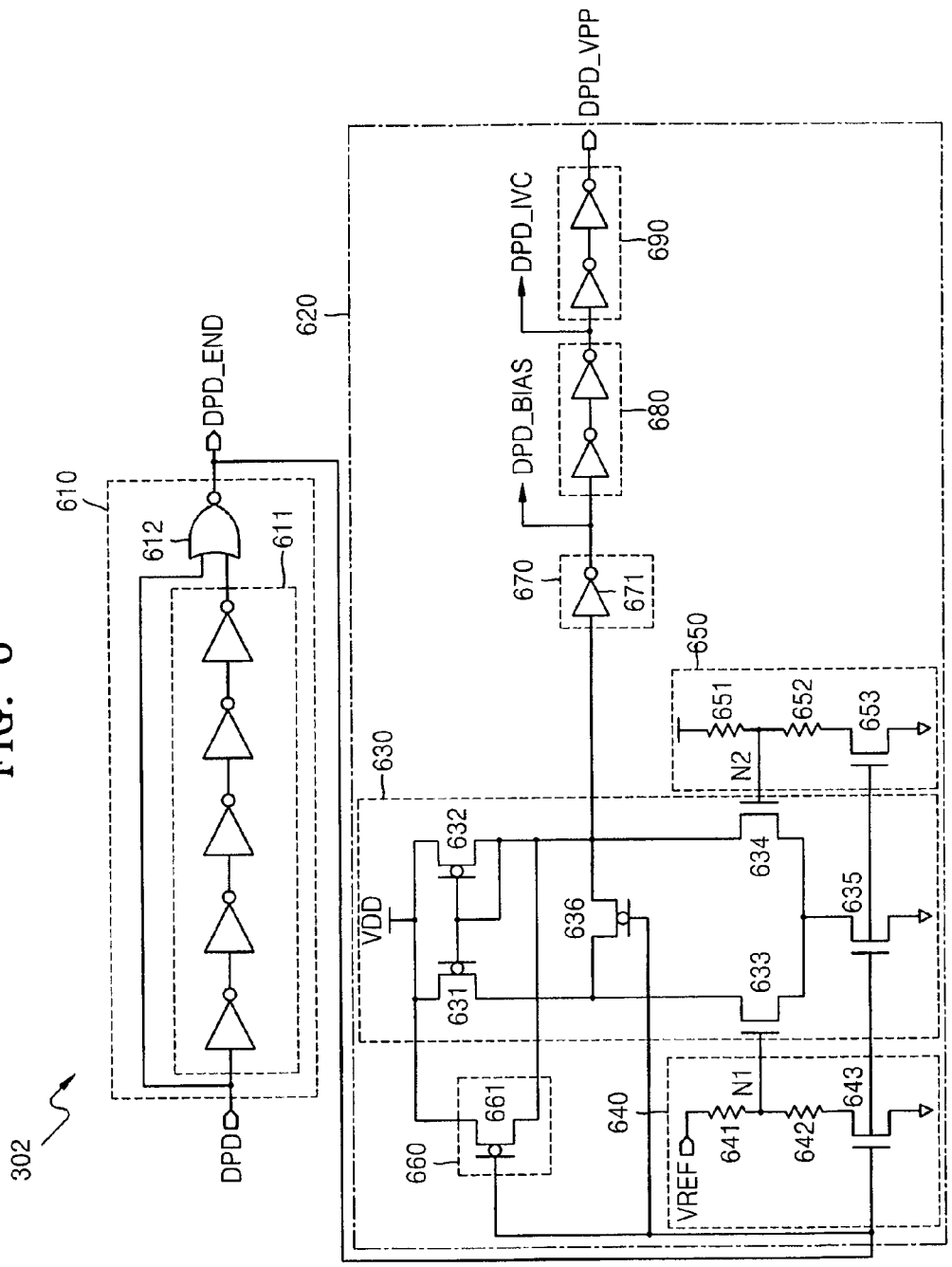
FIG. 6 is a circuit diagram of the pulse generator of FIG. 3 according to another embodiment of the present invention.

FIG. 6 is a circuit diagram of the pulse generating unit 302 according to another embodiment of the present invention. Referring to FIG. 6, the pulse generating unit 302 includes a DPD exit pulse generator 610 and a DPD exit mode signal generator 620. The DPD exit pulse generator 610 generates the DPD exit pulse signal DPD_END having a predetermined pulse width in response to a falling edge of the DPD command signal DPD as does the DPD exit pulse generator 510 of FIG. 5.

The DPD exit mode signal generator 620 includes a comparator 630, a first node voltage generator 640, a second node voltage generator 650, a reset unit 660, a first buffer 670, a second buffer 680 and a third buffer 690.

The comparator 630 includes first and second PMOS transistors 631 and 632. The sources of the first and second PMOS transistors 631 and 632 are connected to a power supply voltage VDD source and their gates are connected to each other. The gate and drain of the second PMOS transistor 632 are connected to each other such that the first and second PMOS transistors 631 and 632 form a current mirror. The comparator 630 further includes first and second NMOS transistors 633 and 634. The drains of the first and second PMOS transistors 631 and 632 are respectively connected to the drains of the first and second NMOS transistors 633 and 634. The gate of the first NMOS transistor 633 is connected to a first node having a first node voltage N1 and the gate of the second NMOS transistor 634 is connected to a second node having a second node voltage N2. The comparator 630 further includes a third NMOS transistor 635 and a third PMOS transistor 636. The source of the third NMOS transistor 635 is connected to the sources of the first and second NMOS transistors 633 and 634 and the gate of the third NMOS transistor 635 receives the DPD exit pulse signal DPD_END. The third PMOS transistor 636 is connected between the drains of the first and second NMOS transistors 633 and 634. The gate of the third PMOS transistor 636 receives the DPD exit pulse signal DPD_END. The drains of the second PMOS transistor 632 and the second NMOS transistor 634 correspond to an output terminal of the comparator 630.

The first node voltage generator 640 includes first and second resistors 641 and 642 and an NMOS transistor 643 serially connected between a reference voltage VREF and a ground voltage. The gate of the NMOS transistor 643 receives the DPD exit pulse signal DPD_END. The connecting node between the first and second resistors 641 and 642 has the first node voltage N1.

The second node voltage generator 650 includes first and second resistors 651 and 652 and an NMOS transistor 653 serially connected between the power supply voltage VDD and the ground voltage. The gate of the NMOS transistor 653 receives the DPD exit pulse signal DPD_END. The connecting node between the first and second resistors 651 and 652 has the second node voltage N2. The second node voltage N2 is higher than the first node voltage N1.

The reset unit 660 includes a PMOS transistor 661 connected between the source of the power supply voltage VDD and the output terminal of the comparator 630. The gate of the PMOS transistor 661 receives the DPD exit pulse signal DPD_END. The first buffer 670 includes an inverter 671 that inverts the output signal of the comparator 630 to generate the DPD exit mode bias signal DPD_BIAS. The second buffer 680 receives the DPD exit mode bias signal DPD_BIAS and generates the DPD exit mode internal power supply signal DPD_IVC. The third buffer 690 receives the DPD exit mode internal power supply signal DPD_IVC and generates the DPD exit mode boosted signal DPD_VPP.

The pulse generating unit 302 generates the DPD exit pulse signal DPD_END having a predetermined pulse width in response to a falling edge of the DPD command signal DPD, compares the first node voltage N1 to the second node voltage N2 in response to a logic high period of the DPD exit pulse signal DPD_END and sequentially generates the DPD exit mode bias signal DPD_BIAS at a logic high level, the DPD exit mode internal power supply signal DPD_IVC at a logic high level and the DPD exit mode boosted signal DPD_VPP at a logic high level. The pulse generating unit 302 then generates the DPD exit bias signal DPD_BIAS at a logic low level, the DPD exit mode internal power supply signal DPD_IVC at a logic low level and the DPD exit mode boosted signal DPD_VPP at a logic low level, in response to a logic low period of the DPD exit pulse signal DPD_END.

Figure 7:
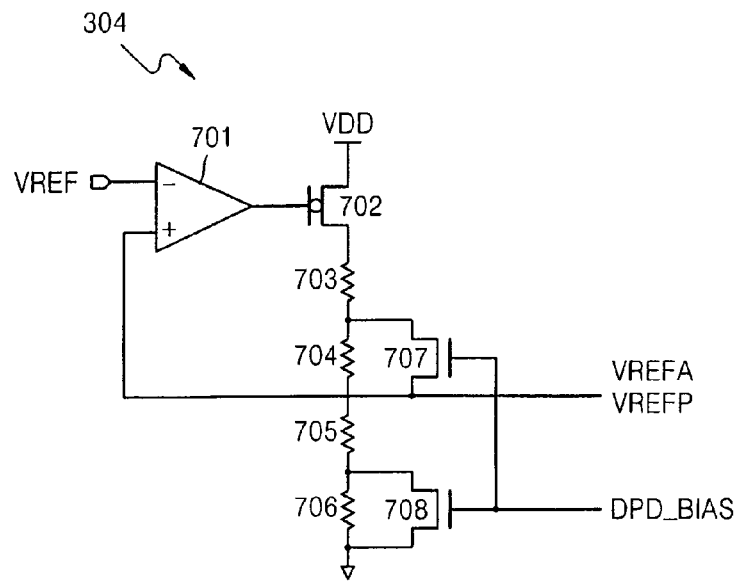
FIG. 7 is a circuit diagram of a current driver of FIG. 3.

FIG. 7 is a circuit diagram of the current driving unit 304 of FIG. 3. Referring to FIG. 7, the current driving unit 304 includes a comparator 701 that compares a reference voltage VREF to a DPD exit mode reference voltage VREFP or VREFA. The reference voltage VREF is generated from the power supply voltage VDD by the DC bias circuit 370 of FIG. 3, which will be explained later. The current driving unit 304 further includes a PMOS transistor 702 and first, second, third and fourth resistors 703, 704, 705 and 705 serially connected between the power supply voltage VDD and the ground voltage. The gate of the PMOS transistor 702 is connected to the output terminal of the comparator 701.

The current driving unit 304 further includes first and second NMOS transistors 707 and 708 that respectively short-circuit the second and fourth resistors 704 and 706 in response to the DPD exit mode bias signal DPD_BIAS. The second resistor 704 has resistance n*R1 corresponding to n times the resistance R1 of the first resistor 703. The fourth resistor 706 has resistance n*R2 corresponding to n times the resistance R2 of the third resistor 705. The DPD exit mode reference voltages VREFP and VREFA are generated at the connecting node between the second and third resistors 704 and 705. The DPD exit mode reference voltage VREFP is provided to the circuits 320 and 360 for generating the internal power supply voltage for driving peripheral circuit blocks in the active mode of the memory device. The DPD exit mode reference voltage VREFA is provided to the circuit 340 for generating the internal power supply voltage for driving memory cell core blocks.

The operation of the illustrated embodiment of the current driving unit 304 will now be explained.

When the DPD exit mode bias signal DPD_BIAS is at a logic low level, the comparator 701 outputs a logic low level signal when the reference voltage VREF is higher than the DPD exit mode reference signals VREFP and VREFA. The PMOS transistor 702 is turned on in response to the output signal of the comparator 701 and thus a first current flows through the first, second, third and fourth resistors 703, 704, 705 and 706. Accordingly, the DPD exit mode reference voltages VREFP and VREFA are increased to be equal to the reference voltage VREF. Then, the comparator 701 generates a logic high level signal and the PMOS transistor 702 is turned off.

When the DPD exit mode bias signal DPD_BIAS is at a logic high level, the comparator 701 outputs a logic low level signal when the reference voltage VREF is higher than the DPD exit mode reference signals VREFP and VREFA. The PMOS transistor 702 is turned on in response to the output signal of the comparator 701 and thus a second current flows through the first resistor 703, the first NMOS transistor 707, the third resistor 705 and the second NMOS transistor 708. The second current is larger than the first current. Accordingly, the DPD exit mode reference voltages VREFP and VREFA are rapidly increased to levels that are higher than the reference voltage VREF. Then, the comparator 701 generates a logic high level signal and the PMOS transistor 702 is turned off.

Figure 8:
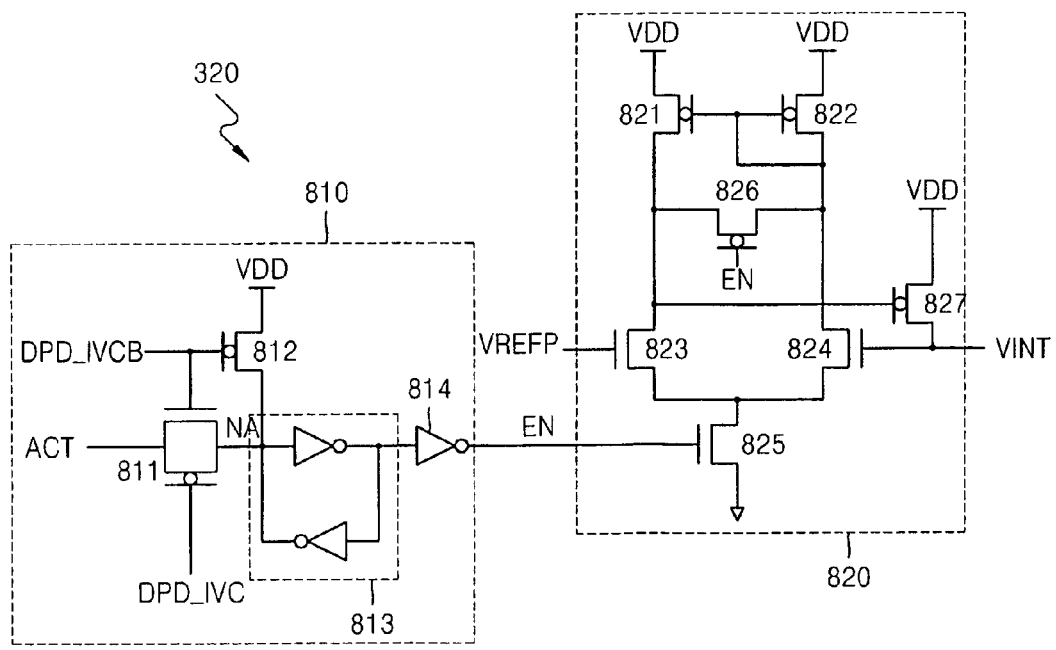
FIG. 8 is a circuit diagram of a circuit of generating an internal power supply voltage for an active mode of FIG. 3 according to an embodiment of the present invention.

FIG. 8 is a circuit diagram of the circuit 320 of generating the internal voltage for the active mode of FIG. 3. Referring to FIG. 8, the circuit 320 includes a controller 810 and a voltage generator 820. The controller 810 includes a transfer gate 811 transferring an active command ACT to a node A NA in response to the DPD exit mode internal power supply signal DPD_IVC and a complementary DPD exit mode internal power supply signal DPD_IVCB, a PMOS transistor 812 that is connected between the power supply voltage VDD and the node A NA and has a gate receiving the complementary DPD exit mode power supply signal DPD_IVCB, a latch 813 for latching the logic level of the node A NA, and an inverter 814 for receiving the output signal of the latch 813 and generating an enable signal EN.

The voltage generator 820 compares the DPD exit mode reference voltage VREFP to an internal power supply voltage VINT in response to the enable signal EN and outputs the internal power supply voltage VINT in response to the compared result. The voltage generator 820 includes first and second PMOS transistors 821 and 822. The sources of the first and second PMOS transistors 821 and 822 are connected to a source of a power supply voltage VDD and their gates are connected to each other. The gate and drain of the second PMOS transistor 822 are connected to each other such that the first and second PMOS transistors 821, 822 form a current mirror.

The voltage generator 820 further includes first and second NMOS transistors 823 and 824. The drains of the first and second NMOS transistors 823 and 824 are respectively connected to the drains of the first and second PMOS transistors 821 and 822. The DPD exit mode reference voltage VREFP is applied to the gate of the first NMOS transistor 823 and the internal power supply voltage VINT is applied to the gate of the second NMOS transistor 824. The voltage generator 820 further includes a third NMOS transistor 825 having a source connected to the sources of the first and second NMOS transistors 823 and 824 and a gate to which the enable signal EN is applied.

The voltage generator 820 further includes a third PMOS transistor 826 connected between the drains of the first and second NMOS transistors 823 and 824. The enable signal EN is applied to the gate of the third PMOS transistor 826. The voltage generator 820 further includes a fourth PMOS transistor 827 connected between the source of the power supply voltage VDD and the internal power supply voltage VINT. The gate of the fourth PMOS transistor 827 is connected to the drains of the first PMOS transistor 821 and the first NMOS transistor 823.

The operations of the illustrated embodiment circuit 320 of the circuit for generating the internal power supply voltage for the active mode in the active mode and the DPD exit mode will now be explained.

In the active mode, the active command ACT at a logic high level, the DPD exit mode internal power supply signal DPD_IVC at a logic low level and the complementary DPD exit mode internal power supply signal DPD_IVCB at a logic high level are input to the circuit 320 for generating the internal power supply voltage for the active mode. The active command ACT at a logic high level passes through the transfer gate 811, the latch 813 and the inverter 814 to become the enable signal EN. The DPD exit mode reference voltage VREFP and the internal power supply voltage VINT are compared to each other in response to the enable signal EN at a logic high level and the internal power supply voltage VINT is output according to the compared result.

In the DPD exit mode, the active command ACT at a logic low level, the DPD exit mode internal power supply signal DPD_IVC at a logic high level and the complementary DPD exit mode internal power supply signal DPD_IVCB at a logic low level are input to the circuit 320 of generating the internal power supply voltage for the active mode. Then, the transfer gate 811 is turned off and the PMOS transistor 812 is turned on, and thus the node A NA becomes a logic high level. The DPD exit mode reference voltage VREFP and the internal power supply voltage VINT are compared to each other in response to the enable signal EN at a logic high level and the internal power supply voltage VINT is output according to the compared result. Here, the DPD exit mode reference voltage VREFP is rapidly increased in the current driving unit 304 of FIG. 7 and thus the internal power supply voltage VINT is also rapidly increased.

Accordingly, the circuit 320 for generating the internal power supply voltage for the active mode increases the internal power supply voltage VINT to a voltage suitable for the active operation in the DPD exit mode before the active command is input to the memory device, and thus the power-up ensuring time period following DPD mode exit can be decreased.

Figure 9:
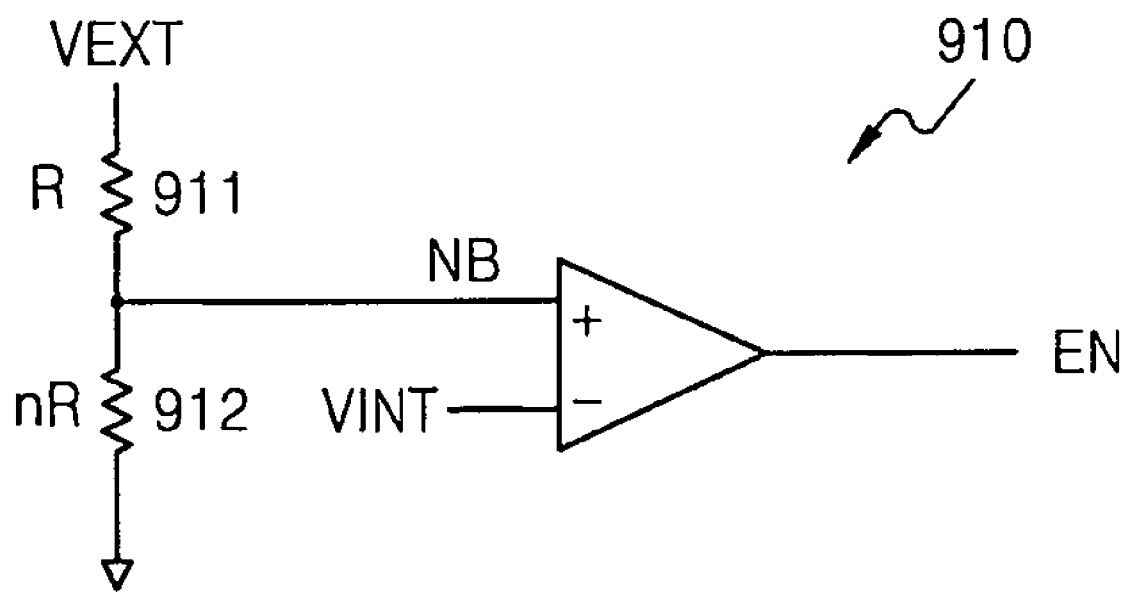
FIG. 9 is a circuit diagram of a controller included in the circuit of generating the internal power supply voltage for the active mode of FIG. 8 according to another embodiment of the present invention.

FIG. 9 is a circuit diagram of the controller 910 included in the circuit 320 of generating the internal power supply voltage for the active mode of FIG. 8 according to another embodiment of the present invention. Referring to FIG. 9, the controller 910 includes first and second resistors 911 and 912 serially connected between an external power supply voltage VEXT and the ground voltage and a comparator 913 for comparing the voltage at a connecting node B NB between the first and second resistors 911 and 912 to the internal power supply voltage VINT. The resistance of the second resistor 912 is set to n times the resistance R of the first resistor 911 such that the voltage at the node B NB is equal to the internal power supply voltage VINT.

The controller 910 generates a logic high enable signal EN when the internal power supply voltage VINT is lower than the voltage at the node B NB irrespective of the operation mode of the memory device. The logic high enable signal EN enables the voltage generator 820 of FIG. 8 such that the DPD exit mode reference voltage VREFP is compared to the internal power supply voltage VINT. The internal power supply voltage VINT is output according to the compared result.

While the above-described embodiments describe the operation of the circuit 320 of generating the internal power supply voltage for the active mode, these embodiments are also applied to the circuit 340 of generating the array internal voltage for the active mode and the circuit 360 of generating the high voltage for the active mode. That is, the circuit 340 for generating the array internal voltage for the active mode compares the DPD exit mode reference voltage VREFA to the array internal power supply voltage VINTA in response to the DPD exit mode internal power supply signal DPD_IVC and the complementary DPD exit mode internal power supply signal DPD_IVCB and outputs the internal power supply voltage VINTA according to the compared result. The circuit 350 for generating the high voltage for the active mode compares the DPD exit mode reference voltage VREFP to the boosted voltage VPP in response to the DPD exit mode internal power supply signal DPD_IVC and the complementary DPD exit mode internal power supply signal DPD_IVCB and outputs the boosted voltage VPP according to the compared result.

Accordingly, the memory device 300 of the present invention previously generates the internal power supply voltage VINT, the array internal power supply voltage VINTA and the boosted voltage VPP, which are used in the active mode, in the DPD exit mode before the active command ACT is applied to the memory device. Thus, the power-up ensuring time after DPD mode exit can be reduced.

While the present invention has been particularly shown and described with reference to exemplary embodiments thereof, it will be understood by those of ordinary skill in the art that various changes in form and details may be made herein without departing from the spirit and scope of the present invention as defined by the following claims.

What is claimed is:

1. A memory device comprising:
 a bias controller receiving a deep power down command and generating a deep power down exit mode bias signal; and
 an internal power supply voltage generator generating an internal power supply voltage used in an active mode in response to an active command or the deep power down exit mode bias signal, wherein the bias controller comprises:
 a pulse generating unit receiving the deep power down command and generating a deep power down exit pulse signal and the deep power down exit mode bias signal; and
 a current driving unit generating a deep power down exit mode reference voltage in response to the deep power down exit mode bias signal and a reference voltage, wherein the pulse generating unit comprises:
 a deep power down exit pulse generator generating the deep power down exit pulse signal having a predetermined pulse width in response to a falling edge of the deep power down command signal; and
 a deep power down exit mode signal generator generating the deep power down exit mode bias signal in response to the deep power down exit pulse signal.

2. The memory device of claim 1, wherein the deep power down exit pulse generator comprises:
   a delay stage delaying and inverting the deep power down command signal; and
   a NOR gate receiving the deep power down command signal and an output signal of the delay stage and outputting the deep power down exit pulse signal.

3. The memory device of claim 1, wherein the deep power down exit mode signal generator comprises a buffer receiving the deep power down exit pulse signal and outputting the deep power down exit mode bias signal.

4. The memory device of claim 1, wherein the deep power down exit mode signal generator comprises:
   a first node voltage generator generating a first node voltage distributed from the reference voltage in response to the deep power down exit pulse signal;
   a second node voltage generator generating a second node voltage distributed from a power supply voltage in response to the deep power down exit pulse signal;
   a comparator comparing the first and second node voltages to each other in response to the deep power down exit pulse signal; and
   a buffer receiving the output signal of the comparator and outputting the deep power down exit mode bias signal.

5. The memory device of claim 4, wherein the first node voltage generator comprises:
   a first resistor having a first terminal to which the reference voltage is applied;
   a second resistor having a first terminal connected to a second terminal of the first resistor; and
   an NMOS transistor connected between a second terminal of the second resistor and a ground voltage, the NMOS transistor having a gate to which the deep power down exit pulse signal is applied,
   wherein the first node voltage is generated at the connecting node between the first and second resistors.

6. The memory device of claim 4, wherein the second node voltage generator comprises:
   a first resistor having a first terminal to which the power supply voltage is applied;
   a second resistor having a first terminal connected to a second terminal of the first resistor; and
   an NMOS transistor connected between a second terminal of the second resistor and the ground voltage, the NMOS transistor having a gate to which the deep power down exit pulse signal is applied,
   wherein the second node voltage is generated at the connecting node between the first and second resistors.

7. A memory device comprising:
   a bias controller receiving a deep power down command and generating a deep power down exit mode bias signal; and
   an internal power supply voltage generator generating an internal power supply voltage used in an active mode in response to an active command or the deep power down exit mode bias signal, wherein the bias controller comprises:
      a pulse generating unit receiving the deep power down command and generating a deep power down exit pulse signal and the deep power down exit mode bias signal; and
      a current driving unit generating a deep power down exit mode reference voltage in response to the deep power down exit mode bias signal and a reference voltage. wherein the current driving unit comprises:
         a comparator comparing the reference voltage to the deep power down exit mode reference voltage;
         a PMOS transistor having a gate receiving the output signal of the comparator and a source to which the power supply voltage is applied;
         first, second, third and fourth resistors serially connected between the drain of the PMOS transistor and the ground voltage;
         a first NMOS transistor connected between both terminals of the second resistor, the first NMIOS transistor having a gate to which the deep power down exit mode bias signal is applied; and
         a second NMOS transistor connected between both terminals of the fourth resistor, the second NMOS transistor having a gate to which the deep power down exit mode bias signal is applied.

8. A memory device comprising:
   a bias controller receiving a deep power down conunand and generating a deep power down exit mode bias signal; and
   an internal power supply voltage generator generating an internal power supply voltage used in an active mode in response to an active command or the deep power down exit mode bias signal, wherein the internal power supply voltage generator comprises:
      a controller generating an enable signal in response to the deep power down exit mode bias signal or the active command; and
      a voltage generator comparing the deep power down exit mode reference voltage to the internal power supply voltage and outputting the internal power supply voltage in response to the enable signal, wherein the controller comprises:
         a transfer gate transferring the active command in response to the deep power down exit mode bias signal;
         a PMOS transistor connected between the power supply voltage and the output terminal of the transfer gate, the PMOS transistor having a gate to which the deep power down exit mode bias signal is applied;
         a latch latching the output signal of the transfer gate; and
         an inverter receiving the output signal of the latch and outputting the enable signal.

9. A memory device comprising:
   a bias controller receiving a deep power down command and generating a deep power down exit mode bias signal; and
   an internal power supply voltage generator generating an internal power supply voltage used in an active mode in response to an active command or the deep power down exit mode bias signal, wherein the internal power supply voltage generator comprises:
      a controller generating an enable signal in response to the deep power down exit mode bias signal or the active command; and
      a voltage generator comparing the deep power down exit mode reference voltage to the internal power supply voltage and outputting the internal power supply voltage in response to the enable signal, wherein the voltage generator comprises:
         a first PMOS transistor having a source to which the power supply voltage is applied;

a second PMOS transistor having a source to which the power supply voltage is applied, a gate and a drain connected to the gate of the first PMOS transistor;

a first NMOS transistor having a drain connected to the drain of the first PMOS transistor and a gate to which the deep power down exit mode reference voltage is applied;

a second NMOS transistor having a drain connected to the drain of the second PMOS transistor and a gate to which the internal power supply voltage is applied;

a third NMOS transistor having a drain connected to the sources of the first and second NMOS transistors, a source to which the ground voltage is applied, and a gate to which the enable signal is applied;

a third PMOS transistor connected between the drains of the first and second NMOS transistors, the third PMOS transistor having a gate to which the enable signal is applied; and a fourth PMOS transistor connected between the power supply voltage and the internal power supply voltage, the fourth PMOS transistor having a gate connected to the drain of the first NMOS transistor.

10. A memory device comprising:

a deep power down exit pulse generator generating a deep power down exit pulse signal having a predetermined pulse width in response to a deep power down command;

a deep power down exit mode signal generator generating a deep power down exit mode bias signal in response to the deep power down exit pulse signal;

a current driving unit generating a deep power down exit mode reference voltage in response to the deep power down exit mode bias signal and a reference signal;

a controller generating an enable signal in response to the deep power down exit mode bias signal or an active command; and a voltage generator comparing the deep power down exit mode reference voltage to an internal power supply voltage in response to the enable signal and outputting the internal power supply voltage.

11. The memory device of claim 10, wherein the deep power down exit pulse generator comprises:

a delay stage delaying and inverting the deep power down command signal; and a NOR gate receiving the deep power down command signal and the output signal of the delay stage and outputting the deep power down exit pulse signal.

12. The memory device of claim 10, wherein the deep power down exit mode signal generator comprises a buffer receiving the deep power down exit pulse signal and outputting the deep power down exit mode bias signal.

13. The memory device of claim 10, wherein the deep power down exit mode signal generator comprises:

a first node voltage generator generating a first node voltage distributed from the reference voltage in response to the deep power down exit pulse signal;

a second node voltage generator generating a second node voltage distributed from a power supply voltage in response to the deep power down exit pulse signal;

a comparator comparing the first and second node voltages to each other in response to the deep power down exit pulse signal; and a buffer receiving the output signal of the comparator and outputting the deep power down exit mode bias signal.

14. The memory device of claim 13, wherein the first node voltage generator comprises:

a first resistor having a first terminal to which the reference voltage is applied;

a second resistor having a first terminal connected to a second terminal of the first resistor; and an NMOS transistor connected between a second terminal of the second resistor and a ground voltage, the NMOS transistor having a gate to which the deep power down exit pulse signal is applied, wherein the first node voltage is generated at the connecting node between the first and second resistors.

15. The memory device of claim 13, wherein the second node voltage generator comprises:

a first resistor having a first terminal to which the power supply voltage is applied;

a second resistor having a first terminal connected to a second terminal of the first resistor; and an NMOS transistor connected between a second terminal of the second resistor and the ground voltage, the NMOS transistor having a gate to which the deep power down exit pulse signal is applied, wherein the second node voltage is generated at the connecting node between the first and second resistors.

16. The memory device of claim 10, wherein the current driving unit comprises:

a comparator comparing the reference voltage to the deep power down exit mode reference voltage;

a PMOS transistor having a gate receiving the output signal of the comparator and a source to which the power supply voltage is applied;

first, second, third and fourth resistors serially connected between the drain of the PMOS transistor and the ground voltage;

a first NMOS transistor connected between both terminals of the second resistor, the first NMOS transistor having a gate to which the deep power down exit mode bias signal is applied; and a second NMOS transistor connected between both terminals of the fourth resistor, the second NMOS transistor having a gate to which the deep power down exit mode bias signal is applied.

17. The memory device of claim 10, wherein the controller comprises:

a transfer gate transferring the active command in response to the deep power down exit mode bias signal;

a PMOS transistor connected between the power supply voltage and the output terminal of the transfer gate, the PMOS transistor having a gate to which the deep power down exit mode bias signal is applied;

a latch latching the output signal of the transfer gate; and an inverter receiving the output signal of the latch and outputting the enable signal.

18. The memory device of claim 10, wherein the voltage generator comprises:

a first PMOS transistor having a source to which the power supply voltage is applied;

a second PMOS transistor having a source to which the power supply voltage is applied, a gate and a drain connected to the gate of the first PMOS transistor;

a first NMOS transistor having a drain connected to the drain of the first PMOS transistor and a gate to which the deep power down exit mode reference voltage is applied;

a second NMOS transistor having a drain connected to the drain of the second PMOS transistor and a gate to which the internal power supply voltage is applied;

a third NMOS transistor having a drain connected to the sources of the first and second NMOS transistors, a source to which the ground voltage is applied, and a gate to which the enable signal is applied;

a third PMOS transistor connected between the drains of the first and second NMOS transistors, the third PMOS transistor having a gate to which the enable signal is applied; and a fourth PMOS transistor connected between the power supply voltage and the internal power supply voltage, the fourth PMOS transistor having a gate connected to the drain of the first NMOS transistor.

* * * * *

UNITED STATES PATENT AND TRADEMARK OFFICE
CERTIFICATE OF CORRECTION

PATENT NO. : 7,548,482 B2
APPLICATION NO. : 11/593967
DATED : June 16, 2009
INVENTOR(S) : Hui-kap Yang et al.

It is certified that error appears in the above-identified patent and that said Letters Patent is hereby corrected as shown below:

Column 12, line 1 delete "voltage." and insert --voltage,--
Column 12, line 12 delete "NMIOS" and insert --NMOS--
Column 12, line 20 delete "conunand" and insert --command--

Signed and Sealed this

Twenty-ninth Day of September, 2009

David J. Kappos
*Director of the United States Patent and Trademark Office*